(12) United States Patent
Feng et al.

(10) Patent No.: US 11,328,674 B2
(45) Date of Patent: May 10, 2022

(54) SHIFT REGISTER UNIT, DRIVING METHOD THEREOF, AND GATE DRIVING CIRCUIT

(71) Applicants: HEFEI BOE JOINT TECHNOLOGY CO., LTD., Hefei (CN); BOE TECHNOLOGY GROUP CO., LTD., Beijing (CN)

(72) Inventors: Xuehuan Feng, Beijing (CN); Sixiang Wu, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/254,728

(22) PCT Filed: Jun. 18, 2020

(86) PCT No.: PCT/CN2020/096865
§ 371 (c)(1),
(2) Date: Dec. 21, 2020

(87) PCT Pub. No.: WO2020/253789
PCT Pub. Date: Dec. 24, 2020

(65) Prior Publication Data
US 2021/0295778 A1 Sep. 23, 2021

(30) Foreign Application Priority Data
Jun. 19, 2019 (CN) .................. 201910534623.X

(51) Int. Cl.
*G09G 3/3266* (2016.01)
*G11C 19/28* (2006.01)

(52) U.S. Cl.
CPC .......... *G09G 3/3266* (2013.01); *G11C 19/28* (2013.01); *G09G 2310/0286* (2013.01); *G09G 2310/061* (2013.01)

(58) Field of Classification Search
CPC ......... G09G 3/3266; G09G 2310/0286; G09G 2310/061; G11C 19/28
See application file for complete search history.

(56) References Cited

U.S. PATENT DOCUMENTS 9,947,274 B2 4/2018 Park et al.
10,547,316 B2 1/2020 Takasugi et al.
(Continued)

FOREIGN PATENT DOCUMENTS

CN 107274838 A 10/2017
CN 108877682 A 11/2018
(Continued)

*Primary Examiner* — Premal R Patel
(74) *Attorney, Agent, or Firm* — Kinney & Lange, P.A.

(57) ABSTRACT

The present disclosure provides a shift register unit, a driving method thereof, and a gate driving circuit. The shift register unit includes: an input circuit configured to receive an input signal from an input signal terminal and output the input signal to a voltage stabilizer node; a voltage-stabilizing circuit configured to input potential of the voltage stabilizer node to a pull-up node and control potential of the voltage stabilizer node under control of potential of the pull-up node; an output circuit configured to receive a clock signal from a clock signal terminal and provide an output signal to an output signal terminal based on the clock signal received under control of the potential of the pull-up node; and a control circuit configured to control potential of the output signal terminal under control of the potential of the pull-up node.

13 Claims, 7 Drawing Sheets

(56) References Cited

U.S. PATENT DOCUMENTS

| | | | |
|---|---|---|---|
| 2012/0038603 A1* | 2/2012 | Chen | G09G 3/36 |
| | | | 345/208 |
| 2012/0051494 A1* | 3/2012 | Yang | G09G 3/3674 |
| | | | 377/67 |
| 2014/0219412 A1* | 8/2014 | Chien | G11C 19/28 |
| | | | 377/68 |
| 2016/0019828 A1* | 1/2016 | Lin | G09G 3/20 |
| | | | 345/214 |
| 2016/0372063 A1* | 12/2016 | Li | G09G 3/3677 |
| 2017/0294165 A1 | 10/2017 | Park et al. | |
| 2018/0337682 A1 | 11/2018 | Takasugi et al. | |
| 2020/0027516 A1 | 1/2020 | Feng | |

FOREIGN PATENT DOCUMENTS

| | | |
|---|---|---|
| CN | 108932930 A | 12/2018 |
| CN | 110189694 A | 8/2019 |
| KR | 100624320 B1 | 9/2006 |
| KR | 20190009216 A | 1/2019 |

\* cited by examiner

SHIFT REGISTER UNIT, DRIVING METHOD THEREOF, AND GATE DRIVING CIRCUIT

CROSS REFERENCE TO RELATED APPLICATIONS

This application is a Section 371 National Stage Application of International Application No. PCT/CN2020/096856, filed Jun. 18, 2020, entitled "SHIFT REGISTER UNIT, DRIVING METHOD THEREOF, AND GATE DRIVING CIRCUIT," which in turn claims priority to the Chinese Patent Application No. 201910534623.X filed on Jun. 19, 2019, which is incorporated herein by reference in its entirety.

TECHNICAL FIELD

The present disclosure relates to the field of display technology, and in particular to a shift register unit, a driving method thereof, and a gate driving circuit.

BACKGROUND

In the field of display technology, for example, in a gate driving circuit of an OLED display device, a shift register unit is usually used to generate a scanning signal for scanning a corresponding row of pixel units on a display panel. A generation of an output signal of the shift register unit depends on potential of a pull-up node in the shift register. However, in practical applications, the potential of the pull-up node may be unstable due to various reasons, thereby affecting the output signal and further affecting display.

SUMMARY

The present disclosure provides a shift register unit, a driving method thereof, and a gate driving circuit.

According to an aspect of the present disclosure, there is provided a shift register unit, including:

an input circuit, coupled to a voltage stabilizer node and an input signal terminal of the shift register unit, and configured to receive an input signal from the input signal terminal and output the input signal to the voltage stabilizer node;

a voltage-stabilizing circuit, coupled to the voltage stabilizer node and a pull-up node of the shift register unit, and configured to input potential of the voltage stabilizer node to the pull-up node and control potential of the voltage stabilizer node under control of potential of the pull-up node;

an output circuit, coupled to the pull-up node and a clock signal terminal and an output signal terminal of the shift register unit, and configured to receive a clock signal from the clock signal terminal, and provide an output signal to the output signal terminal based on the clock signal received under control of the potential of the pull-up node; and a control circuit, coupled to the pull-up node and the output signal terminal, and configured to control potential of the output signal terminal under control of the potential of the pull-up node.

For example, the voltage-stabilizing circuit includes:

a first transistor having a gate and a first electrode coupled to the voltage stabilizer node, and a second electrode coupled to the pull-up node; and a second transistor having a gate coupled to the pull-up node, a first electrode coupled to a first power signal terminal, and a second electrode coupled to the voltage stabilizer node.

For example, the shift register unit further includes: a sensing circuit, coupled to a first control signal terminal, a second control signal terminal, the input signal terminal and the voltage stabilizer node, and configured to store a voltage under control of potential of the first control signal terminal and the input signal terminal, and input potential of the second control signal terminal to the voltage stabilizer node using the voltage stored.

For example, the sensing circuit includes a third transistor, a fourth transistor, a fifth transistor and a capacitor, wherein, the third transistor has a gate coupled to the first control signal terminal, a first electrode coupled to the input signal terminal, and a second electrode coupled to a gate of the fourth transistor;

the fourth transistor has the gate coupled to the second electrode of the third transistor, a first electrode coupled to the second control signal terminal, and a second electrode coupled to a first electrode of the fifth transistor;

the fifth transistor has a gate coupled to the second control signal terminal, the first electrode coupled to the second electrode of the fourth transistor, and a second electrode coupled to the voltage stabilizer node; and the capacitor has a first electrode coupled to the gate of the fourth transistor, and a second electrode coupled to the second electrode of the fourth transistor.

For example, the sensing circuit further includes:

a sixth transistor having a gate coupled to the first control signal terminal, a first electrode coupled to the second electrode of the third transistor, and a second electrode coupled to the gate of the fourth transistor, wherein the second electrode of the third transistor is coupled to the gate of the fourth transistor via the sixth transistor; and a seventh transistor having a gate coupled to the gate of the fourth transistor, a first electrode coupled to the first power signal terminal, and a second electrode coupled to the second electrode of the third transistor.

For example, the input circuit includes an eighth transistor having a gate and a first electrode coupled to the input signal terminal and a second electrode coupled to the voltage stabilizer node.

For example, the control circuit includes:

a pull-down sub-circuit, coupled to the output signal terminal and a pull-down node of the shift register unit, and configured to control the potential of the output signal terminal under control of potential of the pull-down node; and a pull-down control sub-circuit, coupled to the pull-up node, the pull-down node and a second power signal terminal, and configured to control the potential of the pull-down node under control of potential of the pull-up node and the second power signal terminal.

For example, the pull-down control sub-circuit includes a ninth transistor, a tenth transistor, an eleventh transistor and a twelfth transistor, wherein, the ninth transistor has a gate and a first electrode coupled to the second power signal terminal, and a second electrode coupled to the pull-down node;

the tenth transistor has a gate coupled to the pull-up node, a first electrode coupled to a reference signal terminal, and a second electrode coupled to the pull-down node;

the eleventh transistor has a gate coupled to the pull-down node, a first electrode coupled to the voltage stabilizer node, and a second electrode coupled to the pull-up node; and the twelfth transistor has a gate coupled to the pull-down node, a first electrode coupled to the reference signal terminal, and a second electrode coupled to the voltage stabilizer node.

For example, the shift register unit further includes: a reset circuit, coupled to the pull-up node and a reset signal terminal of the shift register unit, and configured to reset the pull-up node under control of potential of the reset signal terminal.

For example, the reset circuit includes:

a thirteenth transistor having a gate coupled to the reset signal terminal, a first electrode coupled to the voltage stabilizer node, and a second electrode coupled to the pull-up node; and a fourteenth transistor having a gate coupled to the reset signal terminal, a first electrode coupled to the reference signal terminal, and a second electrode coupled to the voltage stabilizer node.

For example, the reset signal terminal includes a first reset signal terminal coupled to the thirteenth transistor and the fourteenth transistor, and a second reset signal terminal, and wherein the reset circuit further includes:

a fifteenth transistor having a gate coupled to the second reset signal terminal, a first electrode coupled to the voltage stabilizer node, and a second electrode coupled to the pull-up node; and a sixteenth transistor having a gate coupled to the second reset signal terminal, a first electrode coupled to the reference signal terminal, and a second electrode coupled to the voltage stabilizer node.

According to another aspect of the present disclosure, there is provided a gate driving circuit including N stages of cascaded shift register units, where N is a natural number greater than 3.

According to another aspect of the present disclosure, there is provided a driving method of the shift register unit mentioned above, including:

in a first period, applying an input signal at a first level to an input signal terminal, wherein the input signal at the first level is output to a voltage stabilizer node by an input circuit, and potential of the voltage stabilizer node is input to a pull-up node by a voltage-stabilizing circuit;

in a second period, applying an input signal at a second level to the input signal terminal, wherein potential of the pull-up node causes an output circuit to provide a clock signal of a clock signal terminal to an output signal terminal; and in a third period, applying a reset signal at the first level to a reset signal terminal of the shift register unit to reset the pull-up node, wherein the potential of the pull-up node causes a control circuit to pull down the output signal terminal to the second level, wherein, in the first period and the second period, the potential of the pull-up node causes the voltage-stabilizing circuit to control potential of the voltage stabilizer node within a preset range.

DETAILED DESCRIPTION

Figure 1:
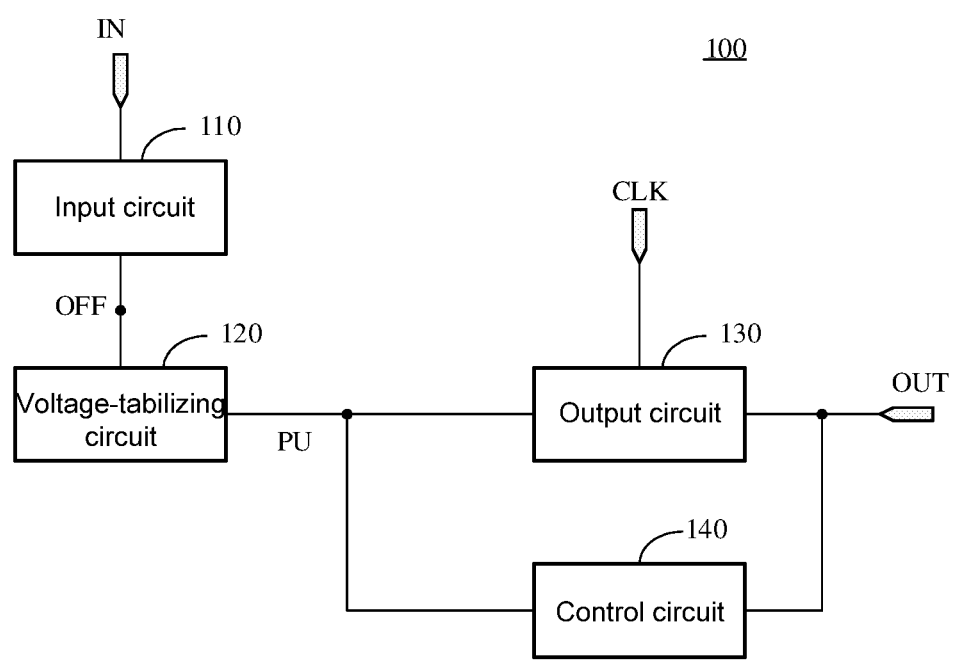
FIG. 1 shows a schematic block diagram of a shift register unit according to an embodiment of the present disclosure.

In order to make objectives, technical solutions and advantages of the present disclosure more clear, the technical solutions of the present disclosure will be clearly and completely described below with reference to the drawings of the embodiments of the present disclosure. Obviously, the embodiments described are only a part but not all of the embodiments of the present disclosure. Based on the embodiments of the present disclosure, all other embodiments obtained by those ordinary skilled in the art without creative work fall within the protection scope of the present disclosure. It should be noted that throughout the drawings, the same elements are represented by the same or similar reference signs. In the following description, some specific embodiments are only used for descriptive purposes and are merely examples of the embodiments of the present disclosure, and should not be construed as limiting the present disclosure. Conventional structures or configurations will be omitted when they may cause confusion in understanding of the present disclosure. It should be noted that the shape and size of each component in the figure do not reflect actual size and ratio, but merely illustrate the content of the embodiments of the present disclosure.

Unless otherwise defined, the technical or scientific terms used in the embodiments of the present disclosure should have usual meanings understood by those skilled in the art. The words "first," "second," and the like used in the embodiments of the present disclosure do not indicate any order, quantity or importance, but are only used to distinguish different composition parts.

In addition, in the description of the embodiments of the present disclosure, the term "coupled" or "coupled to" may mean that two components are directly coupled, or that two components are coupled via one or more other components. In addition, these two components may be coupled or connected by wired or wireless means.

In addition, in the description of the embodiments of the present disclosure, the terms "first level" and "second level" are only used to distinguish amplitude difference between two levels. For example, in the following description, the "first level" is a low level and the "second level" is a high level as an example. Those skilled in the art may understand that the present disclosure is not limited to this.

Transistors used in the embodiments of the present disclosure may all be thin film transistors or field effect transistors or other devices with the same characteristics. Preferably, the thin film transistor used in the embodiments of the present disclosure may be an oxide semiconductor transistor. Since a source and a drain of the thin film transistor used here are symmetrical, the source and the drain may be interchanged. In the embodiments of the present disclosure, one of the source and the drain is called a first electrode, and the other is called a second electrode. In the following examples, an N-type thin film transistor is taken as an example for description. Those skilled in the art may understand that the embodiments of the present disclosure may obviously be applied to the case where the thin film transistor is a P-type thin film transistor.

FIG. 1 shows a schematic block diagram of a shift register unit 100 according to an embodiment of the present disclosure. As shown in FIG. 1, the shift register unit 100 includes an input circuit 110, a voltage-stabilizing circuit 120, an output circuit 130 and a control circuit 140.

The input circuit 110 is coupled to a voltage stabilizer node OFF and an input signal terminal IN of the shift register unit 100. The input circuit 110 may receive an input signal from the input signal terminal IN and output the input signal to the voltage stabilizer node OFF.

The voltage-stabilizing circuit 120 is coupled to the voltage stabilizer node OFF and a pull-up node PU of the shift register unit 100. The voltage-stabilizing circuit 120 may input potential of the voltage stabilizer node OFF to the pull-up node PU, and control potential of the voltage stabilizer node OFF under control of potential of the pull-up node PU.

The output circuit 130 is coupled to the pull-up node PU and a clock signal terminal CLK and an output signal terminal OUT of the shift register unit 100. The output circuit 130 may receive a clock signal from the clock signal terminal CLK, and provide an output signal to the output signal terminal OUT based on the clock signal received under control of the potential of the pull-up node PU.

The control circuit 140 is coupled to the pull-up node PU and the output signal terminal OUT. The control circuit 140 may control potential of the output signal terminal OUT under control of the potential of the pull-up node PU.

In the embodiment of the present disclosure, by providing the voltage-stabilizing circuit 120 in the shift register unit 100 and controlling the potential of the voltage stabilizer node OFF according to the potential of the pull-up node PU, for example, by controlling the voltage stabilizer node at a desired high level when the pull-up node is at a high level, the potential of the pull-up node PU may be stabilized.

Figure 2:
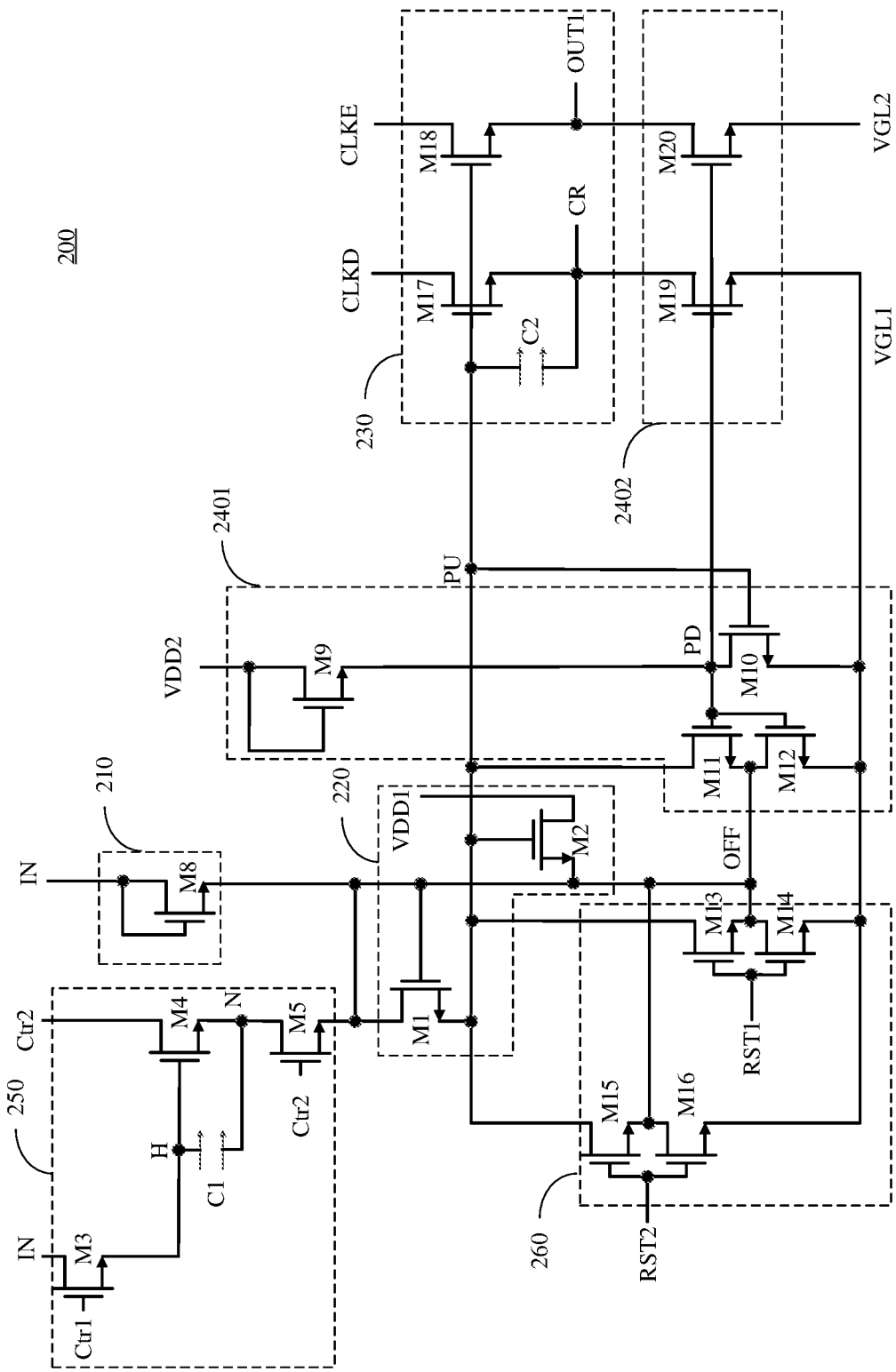
FIG. 2 shows a circuit diagram of a shift register unit according to an embodiment of the present disclosure.

FIG. 2 shows a circuit diagram of a shift register unit 200 according to an embodiment of the present disclosure. As shown in FIG. 2, the shift register unit 200 includes an input circuit 210, a voltage-stabilizing circuit 220, an output circuit 230 and a control circuit.

The input circuit 210 includes an eighth transistor M8. The eighth transistor M8 has a gate and a first electrode coupled to the input signal terminal IN, and a second electrode coupled to the voltage stabilizer node OFF.

The voltage-stabilizing circuit 220 includes a first transistor M1 and a second transistor M2. The first transistor M1 has a gate and a first electrode coupled to the voltage stabilizer node OFF, and a second electrode coupled to the pull-up node PU. The second transistor M2 has a gate coupled to the pull-up node PU, a first electrode coupled to a first power signal terminal VDD1, and a second electrode coupled to the voltage stabilizer node OFF.

The output circuit 230 may include a control output sub-circuit for providing a control output signal and a first output sub-circuit for providing a first output signal. In FIG. 2, the control output sub-circuit includes a seventeenth transistor M17 and a capacitor C2, and the first output sub-circuit includes an eighteenth transistor M18. The seventeenth transistor M17 has a gate coupled to the pull-up node PU, a first electrode coupled to a first clock signal terminal CLKD for providing a first clock signal, and a second electrode coupled to a control output signal terminal CR so as to output a control output signal at the control output signal terminal CR. The capacitor C2 has a first electrode coupled to the gate of the seventeenth transistor M17, and a second electrode coupled to the second electrode of the seventeenth transistor M17. The eighteenth transistor M18 has a gate coupled to the pull-up node PU, a first electrode coupled to a second clock signal terminal CLKE for providing a second clock signal, and a second electrode coupled to a first output signal terminal OUT1 so as to output the first output signal at the first output signal terminal OUT1.

The control circuit may include a pull-down control sub-circuit 2401 and a pull-down sub-circuit 2402. The pull-down control sub-circuit 2401 is coupled to the pull-up node PU, a pull-down node PD and a second power signal terminal VDD2. The pull-down control sub-circuit 2401 may control potential of the pull-down node PD under control of potential of the pull-up node PU and the second power signal terminal VDD2. The pull-down sub-circuit 2402 is coupled to the output signal terminal OUT (for example, the control output signal terminal CR and the first output signal terminal OUT1) and the pull-down node PD. The pull-down sub-circuit 2402 may control potential of the output signal terminal OUT under control of the potential of the pull-down node PD.

In FIG. 2, the pull-down control sub-circuit 2401 includes a ninth transistor M9, a tenth transistor M10, an eleventh transistor M11 and a twelfth transistor M12. The ninth transistor M9 has a gate and a first electrode coupled to the second power signal terminal VDD2, and a second electrode coupled to the pull-down node PD. The tenth transistor M10 has a gate coupled to the pull-up node PU, a first electrode coupled to a reference signal terminal VGL1, and a second electrode coupled to the pull-down node PD. The eleventh transistor M11 has a gate coupled to the pull-down node PD, a first electrode coupled to the voltage stabilizer node OFF, and a second electrode coupled to the pull-up node PU. The twelfth transistor M12 has a gate coupled to the pull-down node PD, a first electrode coupled to the reference signal terminal VGL1, and a second electrode coupled to the voltage stabilizer node OFF.

In FIG. 2, the pull-down sub-circuit 2402 may include a nineteenth transistor M19 and a twentieth transistor M20. The nineteenth transistor M19 has a gate coupled to the pull-down node PD, a first electrode coupled to a reference signal terminal VGL2, and a second electrode coupled to the control output signal terminal CR. The twentieth transistor M20 has a gate coupled to the pull-down node PD, a first electrode coupled to the reference signal terminal VGL2, and a second electrode coupled to the first output signal terminal OUT1. The reference signal terminals VGL1 and VGL2 may provide the same reference level or different reference levels. For example, the reference signal terminal VGL1 may provide a first reference level, and the reference signal terminal VGL2 may provide a second reference level, where the second reference level may be the same as or different from the first reference level. The nineteenth transistor M19 may pull down the control output signal terminal CR to the first reference level under control of potential of the pull-down node PD. The twentieth transistor M20 may pull down the first output signal terminal OUT1 to the second reference level under control of the potential of the pull-down node PD.

In some embodiments, the shift register unit 200 may further include a sensing circuit 250. The sensing circuit is coupled to a first control signal terminal Ctrl, a second control signal terminal Ctr2, the input signal terminal IN and the voltage stabilizer node OFF. The sensing circuit 250 may store a voltage under control of potential of the first control signal terminal Ctrl and the input signal terminal IN, and input potential of the second control signal terminal Ctr2 to the voltage stabilizer node OFF by using the voltage stored.

In FIG. 2, the sensing circuit includes a third transistor M3, a fourth transistor M4, a fifth transistor M5 and a capacitor C1. The third transistor M3 has a gate coupled to the first control signal terminal Ctr1, a first electrode coupled to the input signal terminal IN, and a second electrode coupled to a gate of the fourth transistor M4 at a node H. The fourth transistor M4 has a first electrode coupled to the second control signal terminal Ctr2, and a second electrode coupled to a first electrode of the fifth transistor M5 at a node N. The fifth transistor M5 has a gate coupled to the second control signal terminal Ctr2, and a second electrode coupled to the voltage stabilizer node OFF. The capacitor C1 has a first electrode coupled to the gate of the fourth transistor M4 (i.e. the node H), and a second electrode coupled to the second electrode of the fourth transistor M4 (i.e. the node N). By providing the sensing circuit 250, if the shift register unit 200 is selected in a display phase (that is, a voltage is stored at the node H of the sensing circuit 250), the output signal may be generated as a sensing control signal in a blank phase. If the shift register unit 200 is not selected in the display phase (that is, no voltage is stored at the node H of the sensing circuit 250), no output signal is generated in the blank phase, that is, no sensing control signal is generated. The sensing control signal generated by the shift register unit 200 may cause the pixel unit coupled to the shift register unit 200 to emit light, so that sensing data may be collected from the pixel unit. This will be described in further detail below.

In some embodiments, the shift register unit 200 may further include a reset circuit 260. The reset circuit 260 is coupled to the pull-up node PU and the reset signal terminal. The reset circuit 260 may reset the pull-up node PU under control of potential of the reset signal terminal. For example, the reset circuit 260 includes a first reset sub-circuit configured to reset the pull-up node PU under control of a first reset signal terminal RST1. In FIG. 2, the first reset sub-circuit includes a thirteenth transistor M13 and a fourteenth transistor M14. In some embodiments, the reset circuit 260 may further include a second reset sub-circuit configured to reset the pull-up node PU under control of a second reset signal terminal RST2. In FIG. 2, the second reset sub-circuit includes a fifteenth transistor M15 and a sixteenth transistor M16. The first reset signal terminal RST1 may provide a first reset signal for resetting the shift register unit 200 itself. The second reset signal terminal RST2 may provide a second reset signal for resetting all shift register units in the gate driving circuit, which is also called an overall reset signal.

As shown in FIG. 2, the thirteenth transistor M13 has a gate coupled to the first reset signal terminal RST1, a first electrode coupled to the voltage stabilizer node OFF, and a second electrode coupled to the pull-up node PU. The fourteenth transistor M14 has a gate coupled to the first reset signal terminal RST1, a first electrode coupled to the reference signal terminal VGL1, and a second electrode coupled to the voltage stabilizer node OFF. The fifteenth transistor M15 has a gate coupled to the second reset signal terminal RST2, a first electrode coupled to the voltage stabilizer node OFF, and a second electrode coupled to the pull-up node PU. The sixteenth transistor M16 has a gate coupled to the second reset signal terminal RST2, a first electrode coupled to the reference signal terminal VGL1, and a second electrode coupled to the voltage stabilizer node OFF.

When the input signal terminal IN is at a high level, the eighth transistor M8 and the first transistor M1 are turned on, and the pull-up node PU is at a high level, so that the seventeenth transistor M17 and the eighteenth transistor M18 are turned on, thereby outputting a clock signal of the first clock signal terminal CLKD at the control output signal terminal CR, and outputting a clock signal of the second clock signal terminal CLKE at the first output signal terminal OUT1.

When the reset signal terminal (for example, the first reset signal terminal RST1) is at a high level, the thirteenth transistor M13 and the fourteenth transistor M14 are turned on, thereby resetting the pull-up node PU to a low level. The low level of the pull-up node PU turns off the tenth transistor M10. At this time, since the ninth transistor M9 is in ON-state, a high level of the second power signal terminal VDD2 is input to the pull-down node PD. The high level of the pull-down node PD turns on the nineteenth transistor M19 and the twentieth transistor M20, thereby respectively pulling down the control output signal terminal CR and the first output signal terminal OUT1 to a low level. The high level of the pull-down node PD also turns on the eleventh transistor M11 and the twelfth transistor M12, so that the pull-up node PU remains at a low level.

As shown in FIG. 2, when the pull-up node PU is at a high level, the second transistor M2 in the voltage-stabilizing circuit 220 is turned on, thereby providing a high level (for example, the voltage Voff) of the first power signal terminal VDD1 to the voltage stabilizer node OFF. The transistor coupled to the pull-up node PU may be grounded through the voltage stabilizer node OFF instead of directly grounded. For example, the first electrode of the eleventh transistor M11 is coupled to the voltage stabilizer node OFF instead of directly coupled to the reference signal terminal VGL1. When the pull-up node PU is at a high level and the eleventh transistor M11 is in OFF-state, since the voltage stabilizer node OFF is at a high level, it may prevent a voltage difference between the first electrode and the second electrode of the eleventh transistor M11 from being too large to generate a leakage current flowing through the eleventh transistor M11, thereby preventing the potential of the pull-up node PU from being unstable due to generation of the leakage current. The thirteenth transistor M13 and the fifteenth transistor M15 are also coupled to the voltage stabilizer node in a similar manner, thereby preventing leakage of the pull-up node PU. On the other hand, when the pull-up node PU is at a high level, the second transistor M2 is turned on, so that the voltage stabilizer node OFF is at a high level (for example, the voltage Voff of the first power signal terminal VDD1). The high level of the voltage stabilizer node OFF turns on the first transistor M1, so that the voltage Voff is provided to the pull-up node PU, which further stabilizes the potential of the pull-up node PU.

Although two power signal terminals VDD1 and VDD2 are used in the above embodiments, the embodiments of the present disclosure are not limited thereto. The first power signal terminal VDD1 and the second power signal terminal VDD2 may be implemented using the same power signal terminal, or may be implemented as different power signal terminals, as long as the first power signal terminal VDD1 can control the voltage stabilizer node OFF at a desired high level.

Figure 3:
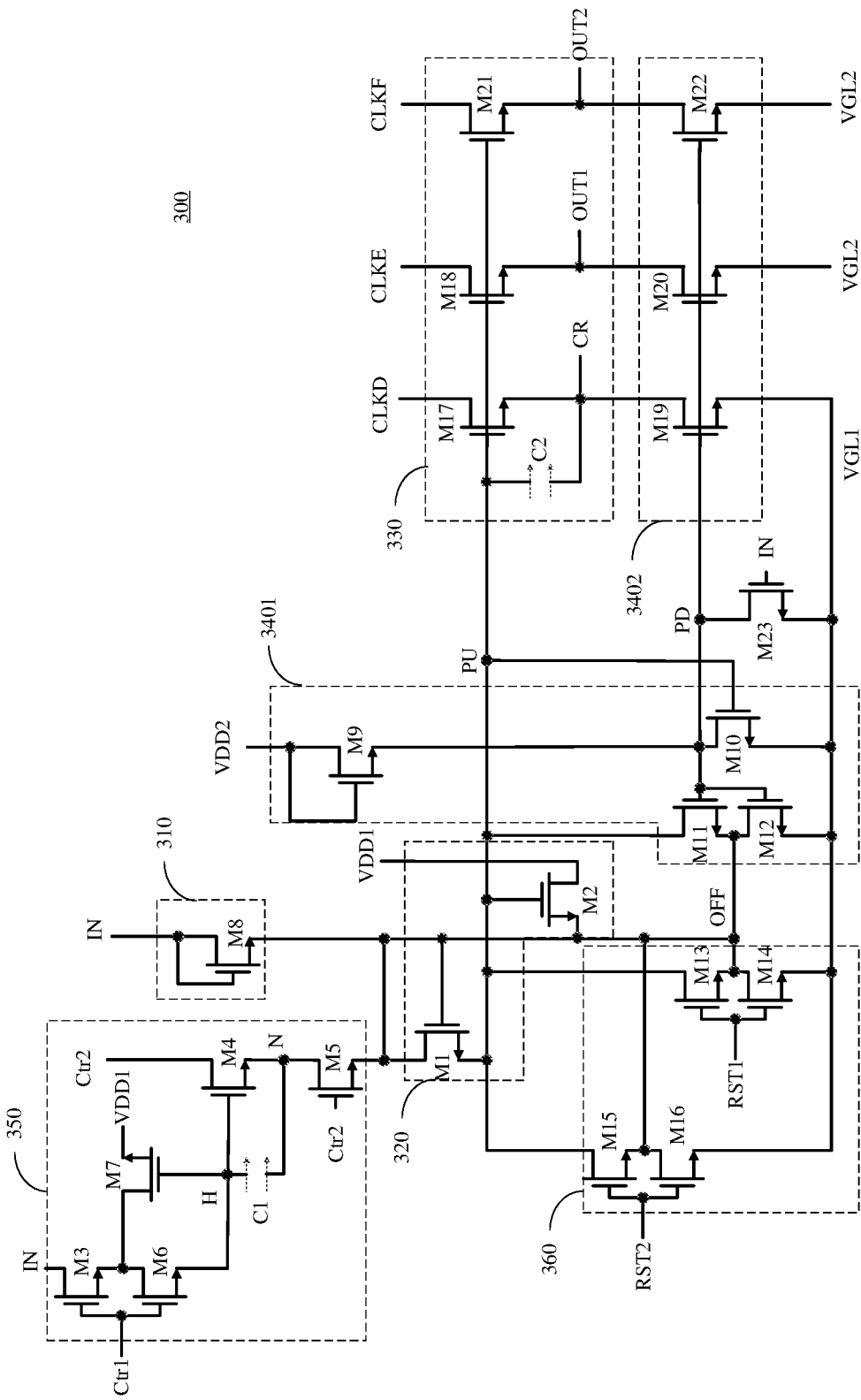
FIG. 3 shows a circuit diagram of a shift register unit according to another embodiment of the present disclosure.

FIG. 3 shows a circuit diagram of a shift register unit 300 according to an embodiment of the present disclosure. The shift register unit 300 of FIG. 3 is similar to the shift register unit 200 of FIG. 2, and a difference between which lies at least in a sensing circuit 350, an output circuit 330 and a pull-down sub-circuit 3402. For the sake of conciseness, different parts will be mainly described in detail below.

As shown in FIG. 3, the shift register unit 300 includes an input circuit 310, a voltage-stabilizing circuit 320, an output circuit 330, a control circuit, a sensing circuit 350 and a reset circuit 360. The control circuit includes a pull-down control sub-circuit 3401 and a pull-down sub-circuit 3402. As shown in FIG. 3, the input circuit 310, the voltage-stabilizing circuit 320 and the reset circuit 360 may be implemented in the same manner respectively as the input circuit 210, the voltage-stabilizing circuit 220 and the reset circuit 260 mentioned above, which is not repeated here.

The sensing circuit 350 differs from the sensing circuit 250 mentioned above at least in that it further includes a sixth transistor M6 and a seventh transistor M7. As shown in FIG. 3, the third transistor M3 and the sixth transistor M6 are coupled in series between the input signal terminal IN and the node H, so that the second electrode of the third transistor M3 is coupled to the node H via the sixth transistor M6. The gates of the third transistor M3 and the sixth transistor M6 are both coupled to the first control signal terminal Ctrl. The first electrode of the third transistor M3 is coupled to the input signal terminal IN. The second electrode of the third transistor M3 is coupled to the first electrode of the sixth transistor M6. The second electrode of the sixth transistor M6 is coupled to node H. The gate of the seventh transistor M7 is coupled to the node H, a first electrode of which is coupled to the first power signal terminal VDD1, and a second electrode of which is coupled to the second electrode of the third transistor M3.

The output circuit 330 differs from the output circuit 230 mentioned above at least in that it further includes a second output sub-circuit for providing a second output signal at the second output signal terminal OUT2. As shown in FIG. 3, the second output sub-circuit includes a twenty-first transistor M21. The twenty-first transistor M21 has a control electrode coupled to the pull-up node PU, a first electrode coupled to a third clock signal terminal CLKF, and a second electrode coupled to the second output signal terminal OUT2. Correspondingly, the pull-down sub-circuit 3402 further includes a twenty-second transistor M22 for pulling down the second output signal terminal OUT2. The twenty-second transistor M22 has a gate coupled to the pull-down node PD, a first electrode coupled to the second reference signal terminal VGL2, and a second electrode coupled to the second output signal terminal OUT2.

In FIG. 3, the shift register unit 300 may further include a twenty-third transistor M23. The twenty-third transistor M23 has a gate coupled to the input signal terminal IN, a first electrode coupled to the first reference signal terminal VGL1, and a second electrode coupled to the pull-down node PD. The twenty-third transistor M23 may further stabilize the potential of the pull-down node PD. For example, when the input signal terminal IN is at a high level, the twenty-third transistor M23 is turned on so as to stabilize the pull-down node PD at a low level.

Figure 4:
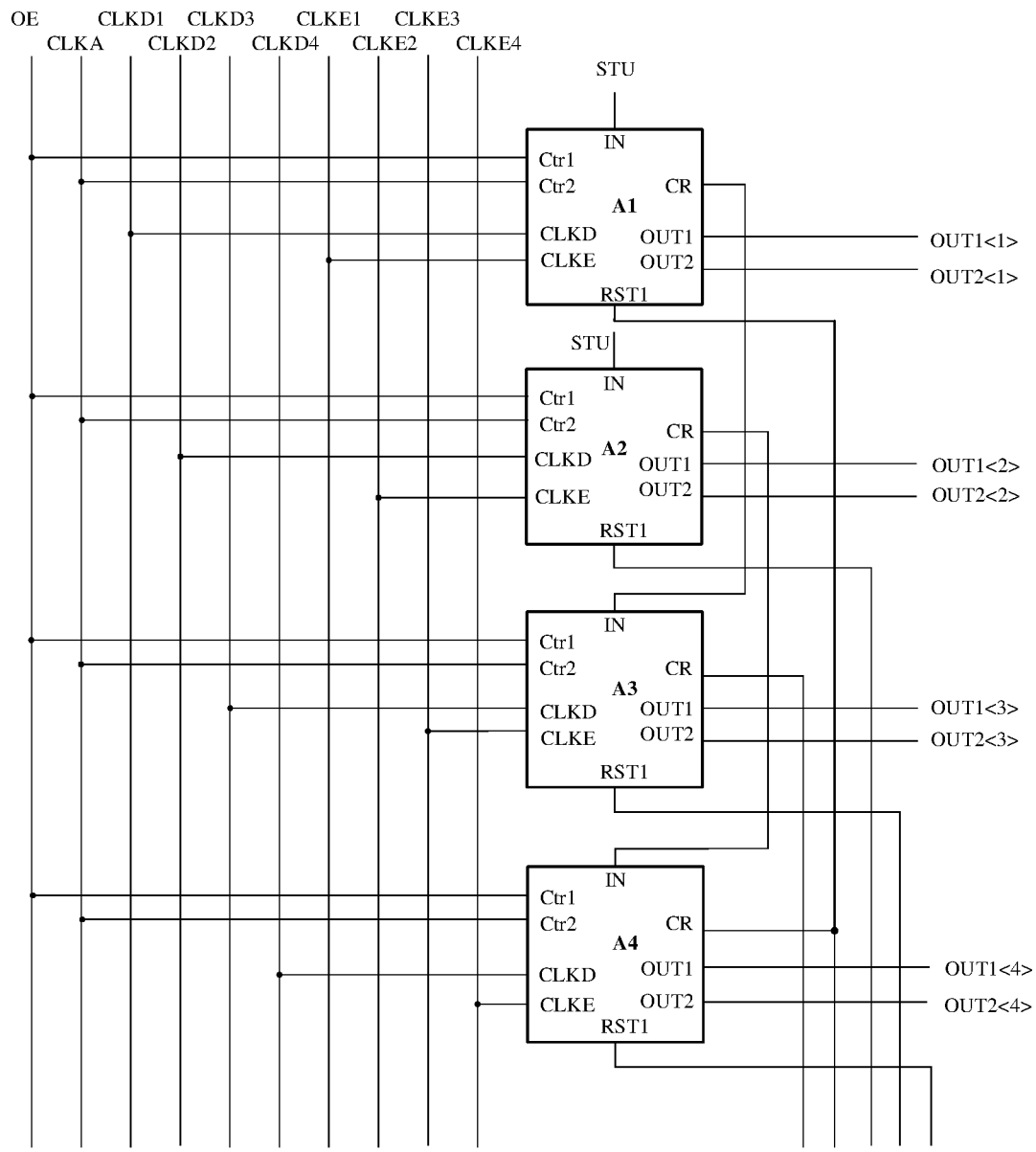
FIG. 4 shows a schematic diagram of a gate driving circuit according to an embodiment of the present disclosure.

FIG. 4 shows a schematic diagram of a gate driving circuit according to an embodiment of the present disclosure. As shown in FIG. 4, the gate driving circuit includes N stages of cascaded shift register units, where N is a natural number greater than 3. For the sake of conciseness, only the first four stages of shift register units A1, A2, A3 and A4 are shown in FIG. 4. However, those skilled in the art should understand that the number of shift register units in the gate driving circuit of the embodiment of the present disclosure is not limited to this, and may be changed as required. Each of the shift register units in the gate driving circuit may be implemented using the shift register unit of any of above-mentioned embodiments, such as any one of above-mentioned shift register units 100, 200 and 300. In the embodiment of FIG. 4, each of the shift register units is implemented using above-mentioned shift register unit 300.

In some embodiments, the gate driving circuit may include shift register units of different structures according to needs. For example, odd-numbered-stage shift register units and even-numbered-stage shift register units may be implemented in different structures. In some embodiments, the odd-numbered-stage shift register units and the even-numbered-stage shift register units may be alternately operated, for example, by controlling the voltage of the second power signal terminal.

Referring to FIG. 4, the input signal terminal IN of the $n^{th}$ stage of shift register unit is coupled to the control output signal terminal CR of the $(n-2)^{th}$ stage of shift register unit, and the reset signal terminal RST1 of the $n^{th}$ stage of shift register unit is coupled to the control output signal terminal CR of the $(n+3)^{th}$ stage of shift register unit. The first control signal terminal Ctrl of the $n^{th}$ stage of shift register unit is coupled to receive a first control signal OE, the second control signal terminal Ctr2 of the $n^{th}$ stage of shift register unit is coupled to receive a second control signal CLKA, and the first output signal terminal OUT1 and the second output signal terminal OUT2 of the $n^{th}$ stage of shift register unit respectively output a first output signal OUT1<n> and a second output signal OUT2<n> of the $n^{th}$ stage, where n is an integer, $3 \le n \le N-3$. In FIG. 4, the shift register units may be divided into multiple groups, and each group includes four cascaded shift register units. The first four stages of shift register units A1 to A4 as one group are described by way of example. The first clock signal terminal CLKD and the second clock signal terminal CLKE of the first stage of shift register unit A1 are coupled to respectively receive clock signals CLKD1 and CLKE1, the first clock signal terminal CLKD and the second clock signal terminal CLKE of the second stage of shift register unit A2 are coupled to respectively receive clock signals CLKD2 and CLKE2. The first clock signal terminal CLKD and the second clock signal terminal CLKE of the third stage of shift register unit A3 are coupled to respectively receive clock signals CLKD3 and CLKE3. The first clock signal terminal CLKD and the second clock signal terminal CLKE of the fourth stage of shift register unit A4 are coupled to respectively receive clock signals CLKD4 and CLKE4. The third clock signal terminal CLKF of each stage of shift register unit may be coupled in a manner similar to the second clock signal terminal CLKE according to needs, which is not repeated here.

The above only gives an example of the gate driving circuit, and the embodiments of the present disclosure are not limited to this. The structure, number and cascade mode of the shift register units in the gate driving circuit may be provided according to needs. For example, each of the shift register units may have more or less output signal terminals, and may provide more or less clock signals to the gate driving circuit, and obtain a desired output signal waveform through corresponding cascade mode.

A driving method of the shift register unit according to an embodiment of the present disclosure will be described below with reference to FIGS. 5 and 6.

Figure 5:
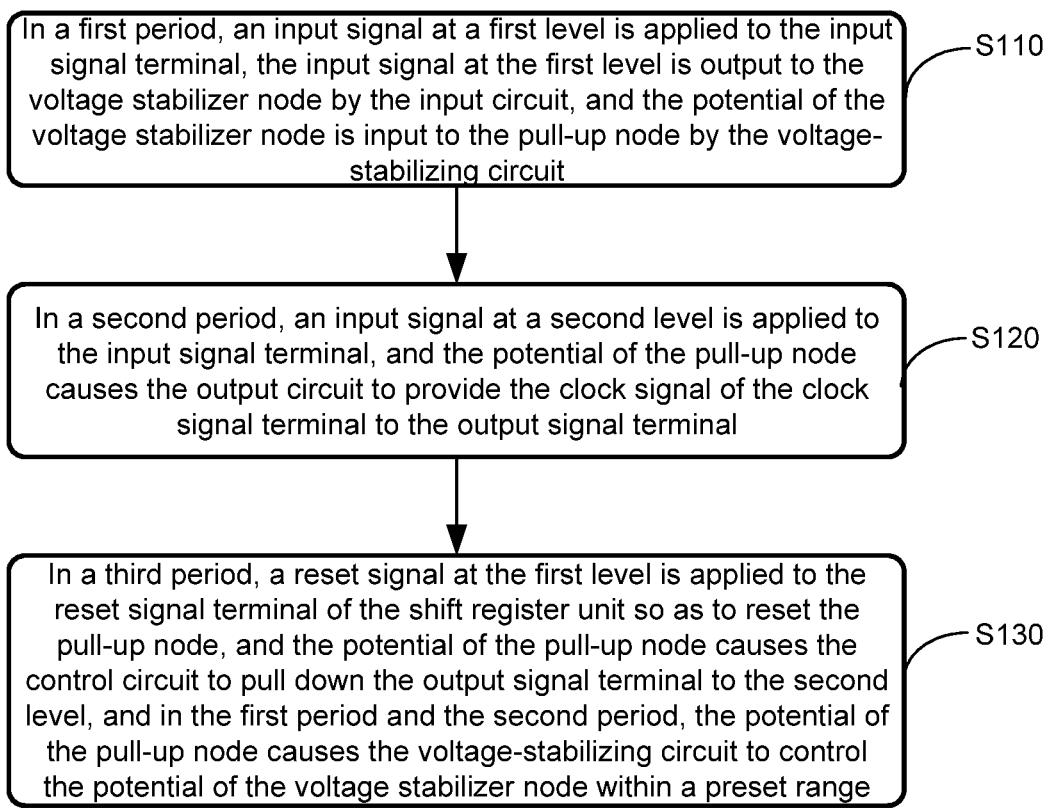
FIG. 5 shows a flowchart of a driving method of a shift register unit according to an embodiment of the present disclosure.

FIG. 5 shows a flowchart of a driving method of a shift register unit according to an embodiment of the present disclosure. The driving method is applicable to the shift register unit of any of above-mentioned embodiments.

In step S110, in a first period, an input signal at a first level is applied to the input signal terminal, the input signal at the first level is output to the voltage stabilizer node by the input circuit, and the potential of the voltage stabilizer node is input to the pull-up node by the voltage-stabilizing circuit.

In step S120, in a second period, an input signal at a second level is applied to the input signal terminal, and the potential of the pull-up node causes the output circuit to provide the clock signal of the clock signal terminal to the output signal terminal.

In step S130, in a third period, a reset signal at the first level is applied to the reset signal terminal of the shift register unit so as to reset the pull-up node, and the potential of the pull-up node causes the control circuit to pull down the output signal terminal to the second level.

In the first period and the second period, the potential of the pull-up node causes the voltage-stabilizing circuit to control the potential of the voltage stabilizer node within a preset range.

Figure 6:
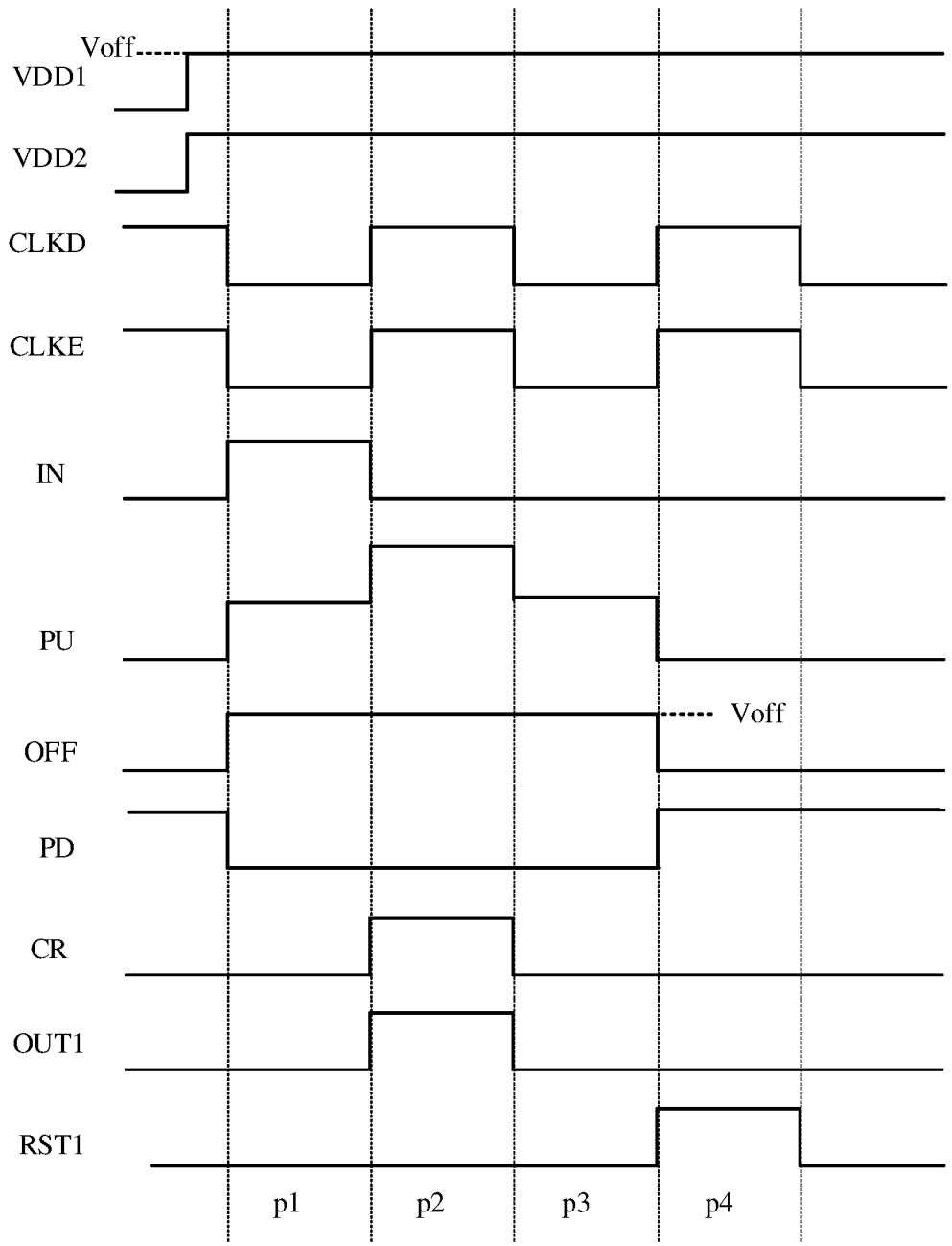
FIG. 6 shows an operation sequence diagram of a shift register unit according to an embodiment of the present disclosure.

FIG. 6 shows an operation sequence diagram of a shift register unit according to an embodiment of the present disclosure. The driving method is applicable to the shift register unit of any of above-mentioned embodiments, and will be described below in conjunction with the structure of the shift register unit 200 in FIG. 2.

In a period p1, the input signal terminal IN is at a high level, and the eighth transistor M8 is turned on, so that the high level of the input signal terminal IN is input to the voltage stabilizer node OFF. The high level of the voltage stabilizer node OFF turns on the first transistor M1, so that the pull-up node PU is at a high level. The high level of the pull-up node PU turns on both the seventeenth transistor M17 and the eighteenth transistor M18. At this time, since the first clock signal terminal CLKD and the second clock signal terminal CLKE are both at a low level, the control output signal terminal CR and the first output signal terminal OUT1 are also at a low level.

In a period p2, the input signal terminal IN is at a low level, and a high level of the first clock signal terminal CLKD and the second clock signal terminal CLKE is arriving. At this time, since the seventeenth transistor M17 and the eighteenth transistor M18 are still in ON-state, the control output signal terminal CR and the first output signal terminal OUT1 are also at a high level. At this time, due to the bootstrap effect of capacitor C2, the potential of the pull-up node PU further rises.

In a period p3, the first clock signal terminal CLKD and the second clock signal terminal CLKE are at a low level. At this time, since the seventeenth transistor M17 and the eighteenth transistor M18 are still in ON-state, the control output signal terminal CR and the first output signal terminal OUT1 are also at a low level.

In a period p4, the first reset signal terminal RST1 is at a high level, and the thirteenth transistor M13 and the fourteenth transistor M14 are turned on, so that the pull-up node PU is reset to a low level (that is, the potential of the reference signal terminal VGL1). The low level of the pull-up node PU turns off the tenth transistor M10. At this time, since the ninth transistor M9 is in ON-state, the high level of the second power signal terminal VDD2 is provided to the pull-down node PD. The high level of the pull-down node PD turns on the nineteenth transistor M19 and the twentieth transistor M20, thereby respectively pulling down the control output signal terminal CR and the first output signal terminal OUT1 to a low level.

During the first period (p1) and second period (p2 and p3) mentioned above, the high level of the pull-up node PU turns on the second transistor M2, thereby providing the high level (for example, the voltage Voff) of the first power signal terminal VDD1 to the voltage stabilizer node OFF. The magnitude of the voltage Voff may be selected according to needs, so that the potential of the voltage stabilizer node OFF may be controlled within a desired range. As analyzed above, during the period when the pull-up node PU is at a high level, the voltage Voff of the voltage stabilizer node OFF makes other transistors coupled to the pull-up node PU not generate leakage current caused by excessive voltage difference between a first electrode and a second electrode. On the other hand, existence of the first transistor M1 enables the high level of the voltage stabilizer node OFF to be transmitted to the pull-up node PU, thereby further stabilizing the potential of the pull-up node PU.

Figure 7:
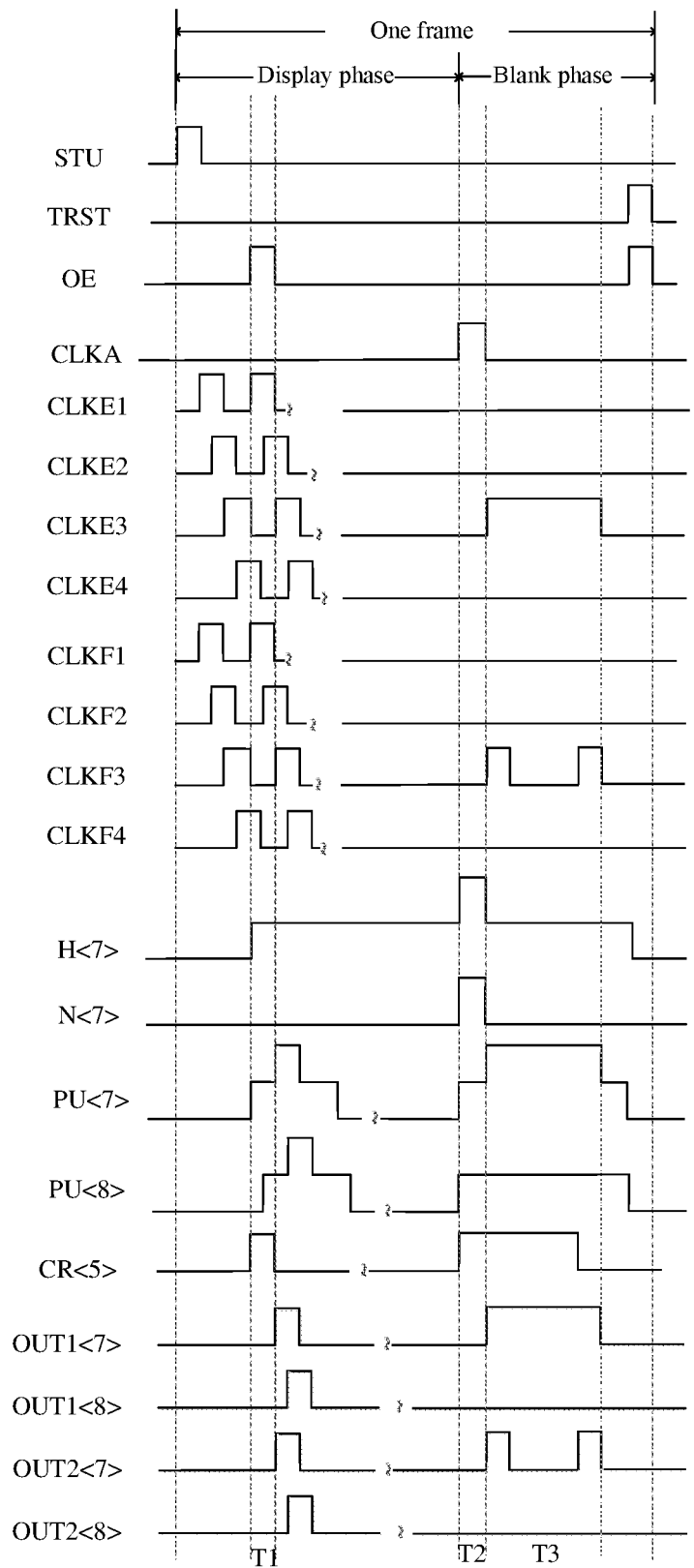
FIG. 7 shows an operation sequence diagram of a gate driving circuit according to an embodiment of the present disclosure.

FIG. 7 shows an operation sequence diagram of a gate driving circuit according to an embodiment of the present disclosure. The following is described with reference to the structure of the gate driving circuit in FIG. 4 and the structure of the shift register unit in FIG. 3. For ease of understanding, FIG. 7 mainly takes the seventh stage of shift register unit as an example to illustrate the operation sequence of the gate driving circuit of the embodiment of the present disclosure. It should be apparent to those skilled in the art that the operation sequence is also applicable to other stages of shift register units.

As shown in FIG. 7, a frame includes a display phase and a blank phase.

In the display phase, each stage of shift register unit generates the output signal according to the input signal and the clock signal thereof. For example, in the example of FIG. 7, the seventh stage of shift register unit generates a first output signal OUT1<7> and a second output signal OUT2<7> according to the clock signal received, and the eighth stage of shift register unit generates a first output signal OUT1<8> and a second output signal OUT2<8> according to the clock signal received. In a period T1 in the display phase, since a first control signal OE and an input signal CR<5> of the seventh stage of shift register unit are both at a high level, the third transistor M3 and the sixth transistor M3 shown in FIG. 3 are turned on, and the high level of the input signal terminal IN is provided to the node H. Due to existence of the capacitor C1, the voltage of node H is stored, as shown by H<7> in FIG. 7. For other shift register units, such as the sixth stage of shift register unit, the first control signal OE and the input signal thereof are not at the high level at the same time, so that no high-level voltage is stored at node H.

In the blank phase, the shift register unit that stores voltage at its node H (that is, the shift register unit that was selected) generates a sensing control signal, while the other shift register units do not generate sensing control signals. For example, in the example of FIG. 7, in a period T2 of the blank phase, the second control signal CLKA is at a high level. For the seventh stage of shift register unit that was selected, since its node H is at a high level, the fourth transistor M4 is turned on, so that the high level of the second control signal terminal Ctr2 (that is, the high level of the second control signal CLKA) is provided to the node N. Due to the bootstrap effect of the capacitor C2, the potential of the node H further rises. The high level of the second control signal terminal Ctr2 also turns on the fifth transistor M5, so that the high level of the second control signal terminal CLKA is provided to the voltage stabilizer node OFF, and is then provided to the pull-up node PU through the first transistor M1. In a period T3 of the blank phase, for the seventh stage of shift register unit, since the potential PU<7> of the pull-up node is high, the transistors M17, M18 and M21 are all turned on, so that the output circuit generates a first output signal OUT1<7> and a second output signal OUT<7> as sensing control signals according to the clock signals received. For other shift register units, such as the sixth stage of shift register unit, since no high-level voltage is stored at the node H thereof, the transistor M4 is in OFF-state when the second control signal CLKA is at a high level in the period T2, the output signal thereof is still at a low level.

In this way, a random selection to the shift register unit in the gate driving circuit is achieved. For example, in this embodiment, the seventh stage of shift register unit is selected as the shift register unit to generate the sensing control signal, and other unselected shift register units do not generate sensing control signals.

Those skilled in the art may understand that the embodiments described above are exemplary, and those skilled in the art may make improvements. The structures described in the various embodiments may be combined freely without conflicts in structure or principle.

After describing preferred embodiments of the present disclosure in detail, those skilled in the art may clearly understand that various changes and modifications may be made without departing from the scope and spirit of the appended claims, and the present disclosure is not limited to the exemplary embodiments described in the present disclosure.

The invention claimed is:

1. A shift register unit, comprising:
an input circuit, coupled to a voltage stabilizer node and an input signal terminal of the shift register unit, and configured to receive an input signal from the input signal terminal and output the input signal to the voltage stabilizer node;
a voltage-stabilizing circuit, coupled to the voltage stabilizer node and a pull-up node of the shift register unit, and configured to input potential of the voltage stabilizer node to the pull-up node and control potential of the voltage stabilizer node under control of potential of the pull-up node;
an output circuit, coupled to the pull-up node and a clock signal terminal and an output signal terminal of the shift register unit, and configured to receive a clock signal from the clock signal terminal, and provide an output signal to the output signal terminal based on the clock signal received under control of the potential of the pull-up node; and
a control circuit, coupled to the pull-up node and the output signal terminal, and configured to control potential of the output signal terminal under control of the potential of the pull-up node.

2. The shift register unit according to claim 1, wherein the voltage-stabilizing circuit comprises:
a first transistor having a gate and a first electrode coupled to the voltage stabilizer node, and a second electrode coupled to the pull-up node; and
a second transistor having a gate coupled to the pull-up node, a first electrode coupled to a first power signal terminal, and a second electrode coupled to the voltage stabilizer node.

3. The shift register unit according to claim 1, further comprising:
a sensing circuit, coupled to a first control signal terminal, a second control signal terminal, the input signal terminal and the voltage stabilizer node, and configured to store a voltage under control of potential of the first control signal terminal and the input signal terminal, and input potential of the second control signal terminal to the voltage stabilizer node using the voltage stored.

4. The shift register unit according to claim 3, wherein the sensing circuit comprises a third transistor, a fourth transistor, a fifth transistor and a capacitor, wherein,
the third transistor has a gate coupled to the first control signal terminal, a first electrode coupled to the input signal terminal, and a second electrode coupled to a gate of the fourth transistor;
the fourth transistor has the gate coupled to the second electrode of the third transistor, a first electrode coupled to the second control signal terminal, and a second electrode coupled to a first electrode of the fifth transistor;
the fifth transistor has a gate coupled to the second control signal terminal, the first electrode coupled to the second electrode of the fourth transistor, and a second electrode coupled to the voltage stabilizer node; and
the capacitor has a first electrode coupled to the gate of the fourth transistor, and a second electrode coupled to the second electrode of the fourth transistor.

5. The shift register unit according to claim 4, wherein the sensing circuit further comprises:
a sixth transistor having a gate coupled to the first control signal terminal, a first electrode coupled to the second electrode of the third transistor, and a second electrode coupled to the gate of the fourth transistor, wherein the second electrode of the third transistor is coupled to the gate of the fourth transistor via the sixth transistor; and
a seventh transistor having a gate coupled to the gate of the fourth transistor, a first electrode coupled to the first power signal terminal, and a second electrode coupled to the second electrode of the third transistor.

6. The shift register unit according to claim 1, wherein the input circuit comprises an eighth transistor having a gate and a first electrode coupled to the input signal terminal and a second electrode coupled to the voltage stabilizer node.

7. The shift register unit according to claim 1, wherein the control circuit comprises:
a pull-down sub-circuit, coupled to the output signal terminal and a pull-down node of the shift register unit, and configured to control the potential of the output signal terminal under control of potential of the pull-down node; and
a pull-down control sub-circuit, coupled to the pull-up node, the pull-down node and a second power signal terminal, and configured to control the potential of the pull-down node under control of potential of the pull-up node and the second power signal terminal.

8. The shift register unit according to claim 7, wherein the pull-down control sub-circuit comprises a ninth transistor, a tenth transistor, an eleventh transistor and a twelfth transistor, wherein,
the ninth transistor has a gate and a first electrode coupled to the second power signal terminal, and a second electrode coupled to the pull-down node;
the tenth transistor has a gate coupled to the pull-up node, a first electrode coupled to a reference signal terminal, and a second electrode coupled to the pull-down node;
the eleventh transistor has a gate coupled to the pull-down node, a first electrode coupled to the voltage stabilizer node, and a second electrode coupled to the pull-up node; and
the twelfth transistor has a gate coupled to the pull-down node, a first electrode coupled to the reference signal terminal, and a second electrode coupled to the voltage stabilizer node.

9. The shift register unit according to claim 1, further comprising: a reset circuit, coupled to the pull-up node and a reset signal terminal of the shift register unit, and configured to reset the pull-up node under control of potential of the reset signal terminal.

10. The shift register unit according to claim 9, wherein the reset circuit comprises:
   a thirteenth transistor having a gate coupled to the reset signal terminal, a first electrode coupled to the voltage stabilizer node, and a second electrode coupled to the pull-up node; and
   a fourteenth transistor having a gate coupled to the reset signal terminal, a first electrode coupled to the reference signal terminal, and a second electrode coupled to the voltage stabilizer node.

11. The shift register unit according to claim 10, wherein the reset signal terminal comprises a first reset signal terminal coupled to the thirteenth transistor and the fourteenth transistor, and a second reset signal terminal, and wherein the reset circuit further comprises:
   a fifteenth transistor having a gate coupled to the second reset signal terminal, a first electrode coupled to the voltage stabilizer node, and a second electrode coupled to the pull-up node; and
   a sixteenth transistor having a gate coupled to the second reset signal terminal, a first electrode coupled to the reference signal terminal, and a second electrode coupled to the voltage stabilizer node.

12. A gate driving circuit comprising N stages of cascaded shift register units according to claim 1, where N is a natural number greater than 3.

13. A driving method of a shift register unit that includes an input circuit, coupled to a voltage stabilizer node and an input signal terminal of the shift register unit, and configured to receive an input signal from the input signal terminal and output the input signal to the voltage stabilizer node; a voltage-stabilizing circuit, coupled to the voltage stabilizer node and a pull-up node of the shift register unit, and configured to input potential of the voltage stabilizer node to the pull-up node and control potential of the voltage stabilizer node under control of potential of the pull-up node; an output circuit, coupled to the pull-up node and a clock signal terminal and an output signal terminal of the shift register unit, and configured to receive a clock signal from the clock signal terminal, and provide an output signal to the output signal terminal based on the clock signal received under control of the potential of the pull-up node; and a control circuit, coupled to the pull-up node and the output signal terminal, and configured to control potential of the output signal terminal under control of the potential of the pull-up node; wherein the driving method comprises:
   in a first period, applying an input signal at a first level to an input signal terminal, wherein the input signal at the first level is output to a voltage stabilizer node by an input circuit, and potential of the voltage stabilizer node is input to a pull-up node by a voltage-stabilizing circuit;
   in a second period, applying an input signal at a second level to the input signal terminal, wherein potential of the pull-up node causes an output circuit to provide a clock signal of a clock signal terminal to an output signal terminal; and
   in a third period, applying a reset signal at the first level to a reset signal terminal of the shift register unit to reset the pull-up node, wherein the potential of the pull-up node causes a control circuit to pull down the output signal terminal to the second level,
   wherein, in the first period and the second period, the potential of the pull-up node causes the voltage-stabilizing circuit to control potential of the voltage stabilizer node within a preset range.

* * * * *